(12) United States Patent
Mohile et al.

(10) Patent No.: US 9,147,534 B2
(45) Date of Patent: Sep. 29, 2015

(54) STEERING COLUMN CONTROL MODULE

(75) Inventors: Vivek V. Mohile, West Bloomfield, MI (US); Vinod Pramadrao Taware, Farmington, MI (US); John Cranick, Hartland, MI (US)

(73) Assignee: KELSEY-HAYES COMPANY, Livonia, MI (US)

( * ) Notice: Subject to any disclaimer, the term of this patent is extended or adjusted under 35 U.S.C. 154(b) by 0 days.

(21) Appl. No.: 14/388,900

(22) PCT Filed: Apr. 26, 2012

(86) PCT No.: PCT/US2012/035160
§ 371 (c)(1),
(2), (4) Date: Jan. 12, 2015

(87) PCT Pub. No.: WO2013/162568
PCT Pub. Date: Oct. 31, 2013

(65) Prior Publication Data
US 2015/0162145 A1    Jun. 11, 2015

(51) Int. Cl.
| | | |
|---|---|---|
| *B60R 16/02* | (2006.01) | |
| *H01H 9/08* | (2006.01) | |
| *B60R 16/027* | (2006.01) | |
| *B60Q 1/00* | (2006.01) | |
| *H05K 1/18* | (2006.01) | |

(52) U.S. Cl.
CPC .............. *H01H 9/08* (2013.01); *B60Q 1/0082* (2013.01); *B60R 16/027* (2013.01); *H05K 1/18* (2013.01); *H05K 2201/10189* (2013.01); *H05K 2201/10356* (2013.01)

(58) Field of Classification Search
CPC ..................................................... B60R 16/027
USPC ......................................................... 200/61.54
See application file for complete search history.

(56) References Cited

U.S. PATENT DOCUMENTS

| | | | | |
|---|---|---|---|---|
| 5,827,081 | A | * | 10/1998 | Sakamaki ..................... 439/164 |
| 5,977,495 | A | * | 11/1999 | Akimoto .................... 200/61.54 |
| 6,583,373 | B2 | | 6/2003 | Ketzer et al. |
| 6,731,020 | B2 | | 5/2004 | Burr et al. |
| 6,776,634 | B2 | * | 8/2004 | Besier et al. .................. 439/164 |
| 7,504,600 | B2 | | 3/2009 | Hallet et al. |
| 2008/0142345 | A1 | | 6/2008 | Heite et al. |

OTHER PUBLICATIONS

PCT/US2012/035160 International Search Report and Written Opinion, completed Jun. 27, 2012.

* cited by examiner

*Primary Examiner* — Ruth Ilan
(74) *Attorney, Agent, or Firm* — Tarolli, Sundheim, Covell & Tummino LLP

(57) ABSTRACT

A steering column control module comprises a housing having at least two receptacles. A printed circuit board is mounted in the housing, the printed circuit board carrying first and second electrical connectors. A third electrical connector is mounted in the housing remote from the printed circuit board. A ribbon cable is connected between the second and third electrical connectors. The receptacles are adapted to receive respective switch modules. The first and third electrical connectors are positioned and configures so that, when plugged into respective receptacles, the switch modules connect to respective ones of the first and third electrical connectors.

19 Claims, 6 Drawing Sheets

STEERING COLUMN CONTROL MODULE

FIELD OF THE INVENTION

The present invention is directed to an arrangement for connecting multi-switch modules to a steering column control module.

BACKGROUND

A number of electromechanical systems are mounted on the steering wheel and steering column of typical, present day motor vehicle. A steering column control module ("SCCM"), positioned on the steering column just below the steering wheel, functions as a central nexus for the systems. Stalk lever switches are attached to the left and right sides of the SCCM. These, as well as steering-wheel mounted controls and systems (e.g. radio controls, cruise controls, horn switches, and air bags), are interconnected with other vehicular systems through the SCCM. The SCCM includes arrangements of circuit boards, wire cables, and multi-pin connectors for providing the necessary junctions between systems. U.S. Pat. Nos. 6,393,011, 7,595,457 and 7,819,427 show examples of such switches and control modules.

The SCCM surrounds the steering column, and it can be challenging to design the SCCM to provide efficient and effective routing of electrical connections between the many components and subsystems in the steering column assembly.

SUMMARY OF THE INVENTION

The present invention provides a steering column control module having an efficient and effective connecting arrangement between various circuit and system elements.

In accordance with one example embodiment of the present invention, a steering column control module is described that includes a housing having at least two receptacles. A printed circuit board is mounted in the housing and has a first module connector and a ribbon connector mounted thereon. A second module connector is mounted in the housing at a location remote from the printed circuit board. A ribbon cable connects the ribbon connector and the second module connector. The first and second module connectors are positioned such that, when switch modules are inserted into respective receptacles, the switch modules connect to respective ones of the first and second module connectors.

In accordance with a specific example embodiment of the present invention, a steering column control module is described that includes a housing adapted for mounting on a steering column of a motor vehicle, where the housing has at least two receptacles for receiving respective plug-in multi-switch modules. The two receptacles are disposed on opposite sides of said steering column when the housing is installed on a steering column. A printed circuit board is mounted in the housing. The printed circuit board carries electrical bus interface components for digital communication with downstream vehicle systems. The printed circuit board a plurality of electrical connectors mounted thereon including (a) a first module connector adapted to receive and mate with a matching electrical connector on a plug-in multi-switch module, (b) a ribbon connector adapted to receive one end of a ribbon cable, (c) an upstream connector adapted for connection with electrical components upstream from the module, and (d) a downstream connector adapted for connection with vehicle systems downstream from the module. A ribbon cable having first and second ends is included in the module. The second end is plugged into the ribbon connector on the printed circuit board. A second module connector is mounted in the module, remote from the printed circuit board. The second module connector is adapted to receive and mate with a matching connector on a plug-in multi-switch module. The first end of the ribbon cable is electrically joined to the second module connector. The first and second module connectors are mounted with respect to respective receptacles so that, when the multi-switch modules are plugged into the respective receptacles, each said first and second module connectors receives and mates with the matching connector of the respective multi-switch module.

BRIEF DESCRIPTION OF THE DRAWINGS

The foregoing and other features and advantages of the present invention will become apparent to those skilled in the art to which the present invention pertains upon reading the following description with reference to the accompanying drawings, in which.

DETAILED DESCRIPTION

Figure 1:
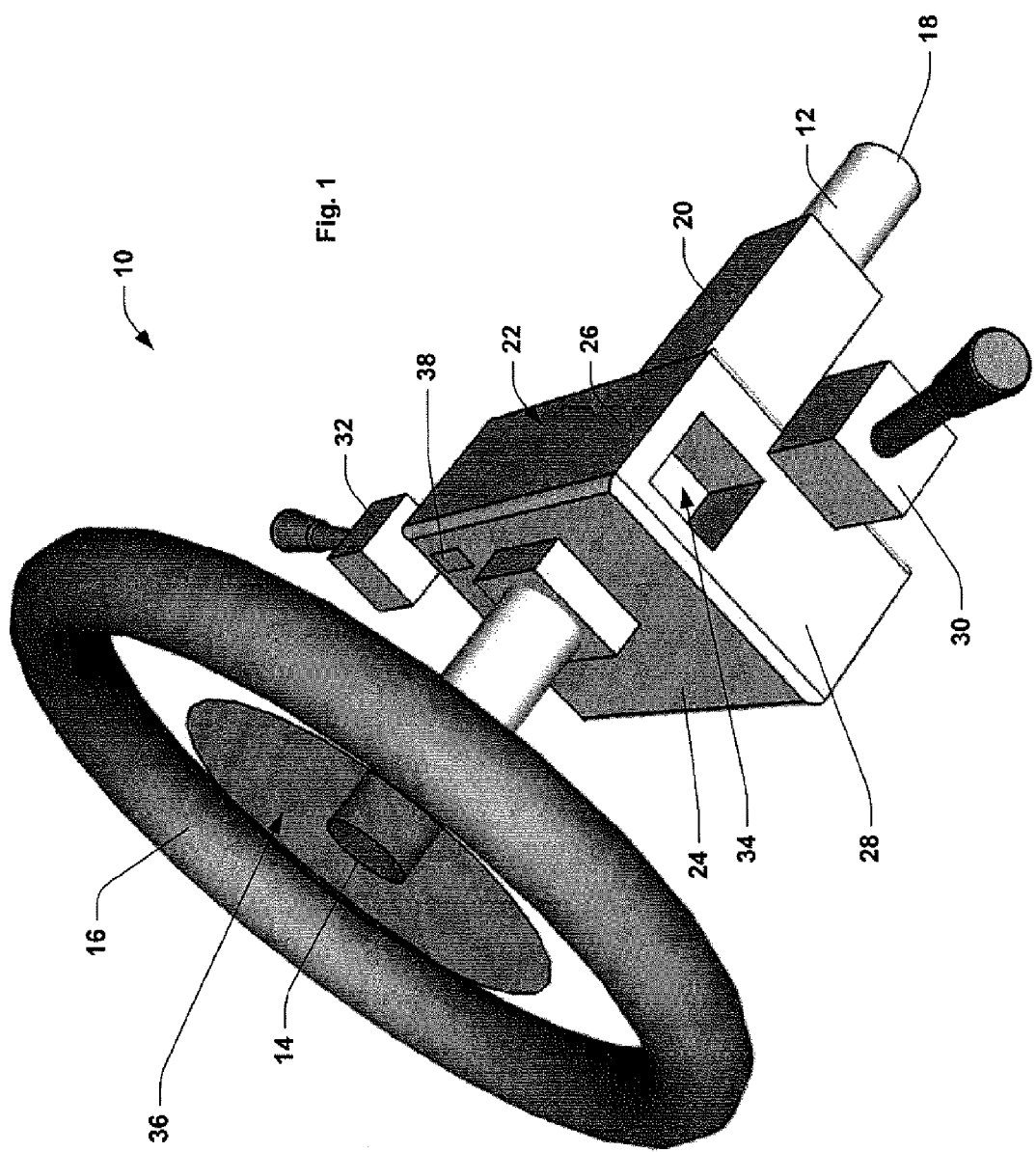
FIG. 1 is a schematic representation of a steering column assembly, showing the location of the SCCM relative to other parts of the assembly.

Referring to FIG. 1, a steering column assembly 10 for a motor vehicle is shown. The core of the assembly 10 is a steering column 12 having one axial end 14 to which a steering wheel 16 is attached and a second axial end 18 to which the vehicle's steering mechanism, e.g. a power rack & pinion steering gear, not shown, is attached. The steering column 12 and steering wheel 16 are secured to rotate together about the axis of the steering column within a mounting structure 20. The mounting structure 20 has a square cross section, is rigidly fixed to the frame of the vehicle (not shown), and passes through the firewall of the engine compartment (also not shown). The steering column is rotationally supported by bearings in the mounting structure 20.

A steering column control module ("SCCM") 22 is affixed to the mounting structure 20, and thus to the vehicle, and serves as a central interconnection nexus for many electrical systems that are mounted on the steering column assembly 10. The SCCM has a housing including, for purposes of reference, a front surface 24, a top surface 26, and a right surface 28, the remaining surfaces being hidden in the FIG. 1 view. A rectangular hole is defined in the SCCM, running from the front to the back of the SCCM housing, and is sized and configured to receive the steering wheel mounting structure 20. When the steering column assembly is being constructed, the SCCM 22 is slipped over and fastened to mounting structure 20 before the steering wheel 16 is installed on the end 14 of the steering column 12 via a conventional hub and spoke arrangement, not shown in detail.

Right and left stalk switch modules 30 and 32 plug into the SCCM 22. The stalk switch modules, which are of conventional design, include multiple electro-mechanical switches and are therefore, in a more generic sense, multi-switch modules. Each module includes one or more stalk or lever-actuated switches disposed in a switch block at the root of the stalk and one or more rotary switches operable with a knob mounted at the distal end of the stalk. Commonly, the right stalk switch module 30 is configured as windshield wiper controls and the left stalk switch module 32 is configured as headlamp controls.

The housing of the SCCM 22 has associated side recesses defining receptacles for receiving the right and left stalk switch modules 30 and 32. Only the receptacle 34 for the right stalk switch module 30 is visible in FIG. 1, but a similar side receptacle (58, see FIGS. 2 and 3) exists on the left side of the SCCM 22 for receiving the left stalk switch module 32. Each receptacle has mounted in the bottom thereof an electrical module connector that mates with a matching connector on the bottom of the respective stalk switch module. These module connectors are not shown in FIG. 1 but will be discussed in greater length below.

A number of other electrical controls and elements are located in front of the SCCM (closer to the driver), generally in the area of the hub 36 of the steering wheel 16. Such controls will sometimes be described herein as 'upstream' from SCCM 22, meaning that they are further away, or more remote, from the vehicle wiring harness and the vehicle body control modules than is SCCM 22. Among these controls and elements may be radio controls, cruise controls, a vehicle horn, and squibs or igniters of a single or multiple stage driver-side air bag. The hub-mounted controls and elements, which are not individually shown, are connected to other vehicle systems via the SCCM. An electrical cable running from the hub-mounted controls and elements plugs into an upstream connector 38 on the front face of the SCCM 22.

The controls and elements rotate with the steering wheel and steering column, however SCCM 22 and thus upstream connector 38 are fixed and do not rotate. To accommodate the rotation of the controls and elements, a so-called 'clock-spring mechanism' is mounted between the steering wheel hub 36 and the SCCM 22. The clock-spring mechanism, which is conventional and is not shown, includes a wire cable wound around the steering column with sufficient slack so that the steering wheel can turn, for example, two and one half full turns, lock to lock, without imposing undue tension upon the cable.

Figure 2:
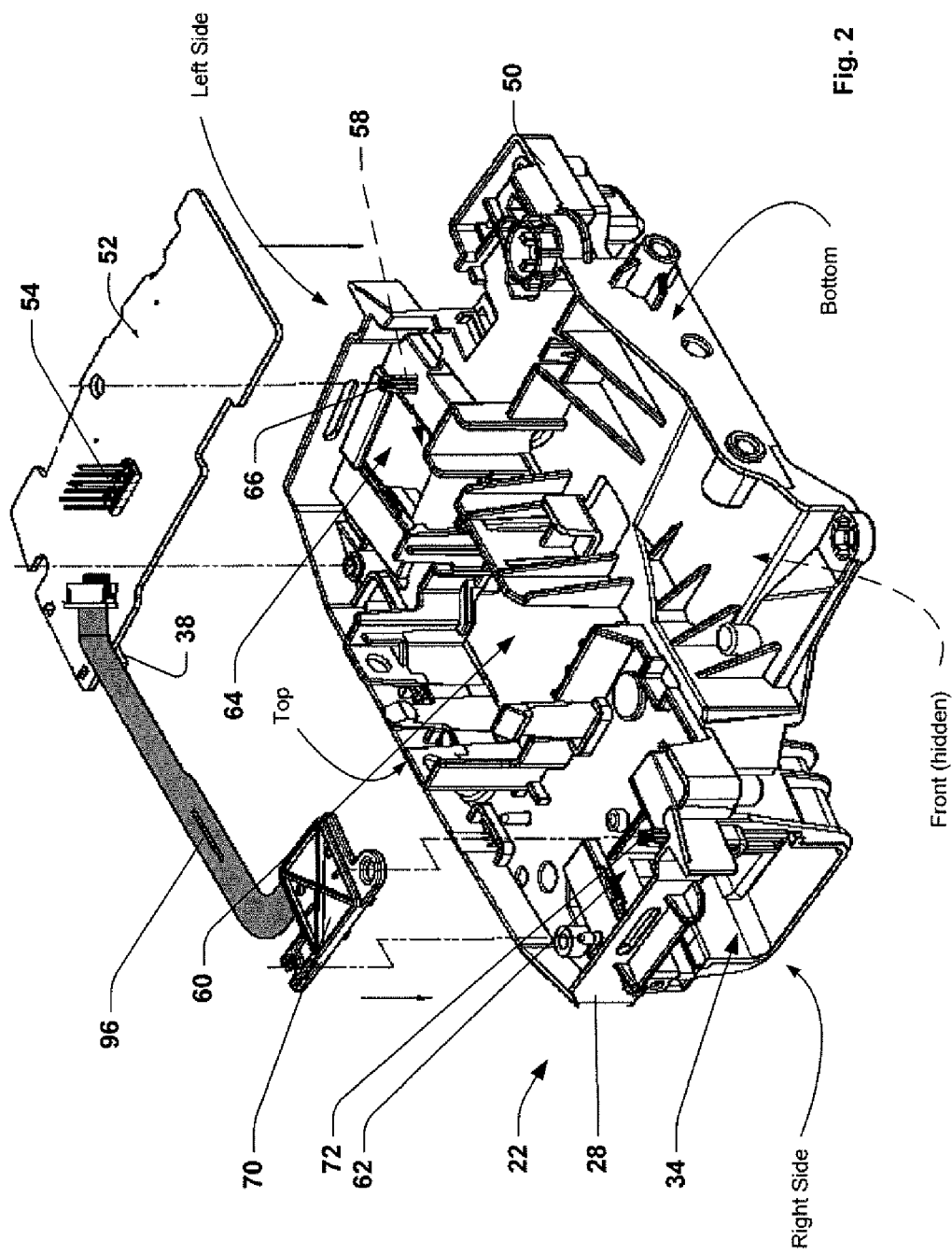
FIG. 2 is an exploded rear perspective view of the SCCM housing showing its printed circuit board and connectors.
Figure 3:
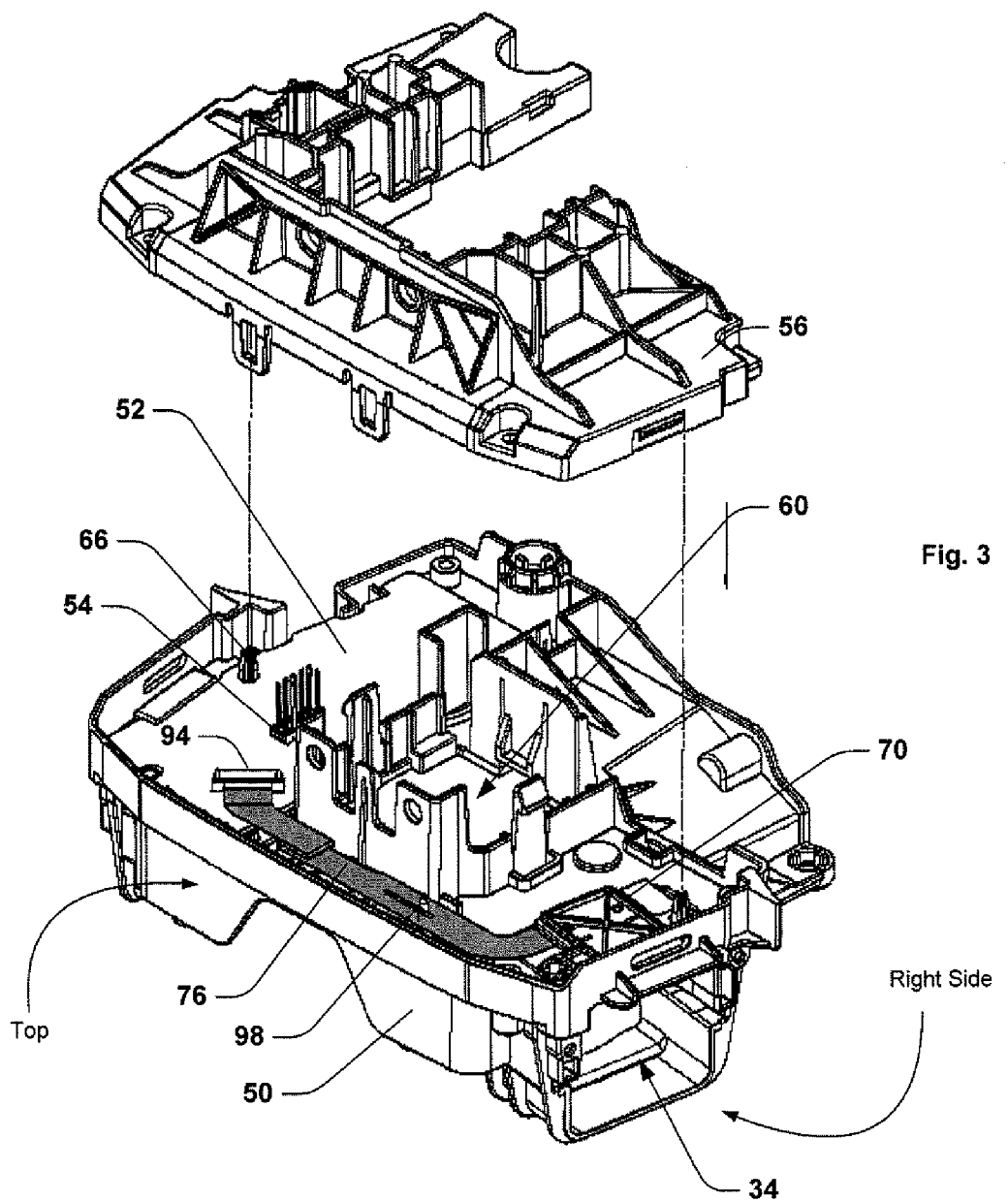
FIG. 3 is an exploded rear perspective view of the SCCM housing and cover.

Referring to FIGS. 2 and 3, the housing 50 of the SCCM 22 has mounted therein a printed circuit board ("PCB") 52. PCB 52 is connected to, and receives electrical signals from, the connectors for the stalk switch modules 30 and 32 and the upstream connector 38. PCB 52 combines the signals in various ways and forwards them to other vehicle systems via a downstream connector 54. Downstream connector 54, which is directly mounted on the rear of PCB 52 in such a position as to be accessible through a window in a rear cover 56 of SCCM 22, will mate with a matching connector on the vehicle wiring harness. The vehicle wiring harness will distribute the signals to the vehicle body control module and other vehicle systems. Systems and components coupled to SCCM 22 via downstream connector 54 are considered 'downstream' from SCCM 22.

Electrical connectors must be mounted at several locations around the SCCM 22, and notably adjacent side receptacles 34 and 58. The side receptacles 34 and 58 are on opposite sides of the central mounting hole 60. In previous known designs, a printed circuit board was provided that had an elongated profile designed to extend around the central mounting hole 60. This profile from the known design was used so that the printed circuit board could carry connectors for both receptacles. This known printed circuit board design was relatively fragile and inconvenient to install. Further, the spacing between the two connectors in the known design was established by the rigid dimensions of the printed circuit board, hence the connector location relative to the respective receptacle was not independent for each receptacle.

In the example embodiment being described of the present invention, a new approach is used for providing connectors adjacent each receptacle, where the arrangement is flexible and each connector is located independently of the other.

The housing surfaces defining side receptacles 34 and 58 each have a corresponding back window 62, 64 for receiving an associated connector. PCB 52 is mounted directly over window 64, its position established by a locating pin 66 molded into the housing 50 and by a screw fastener (not shown). A stalk switch module connector 68, not visible in the drawings but identical to connector 74 to be described hereafter, is mounted directly to the PCB on its front face, in registration with the window. The pins of the module connector face the open end of the side receptacle 58 such that, upon installation of the left stalk switch module 32, they mate with the pins of the complementary connector carried by the left stalk switch module 32.

Figure 4:
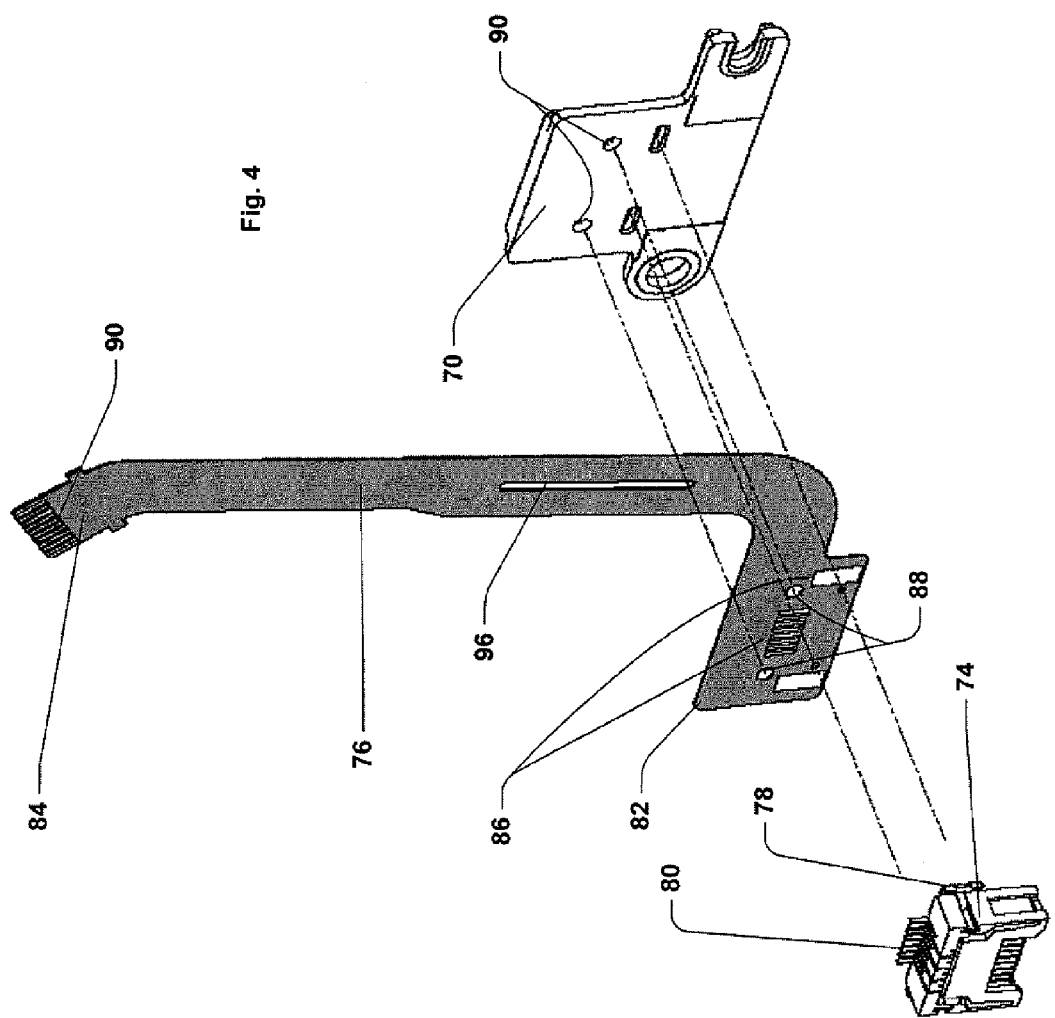
FIG. 4 is an exploded perspective view of a ribbon cable and a connector arrangement attached to one end thereof.
Figure 5:
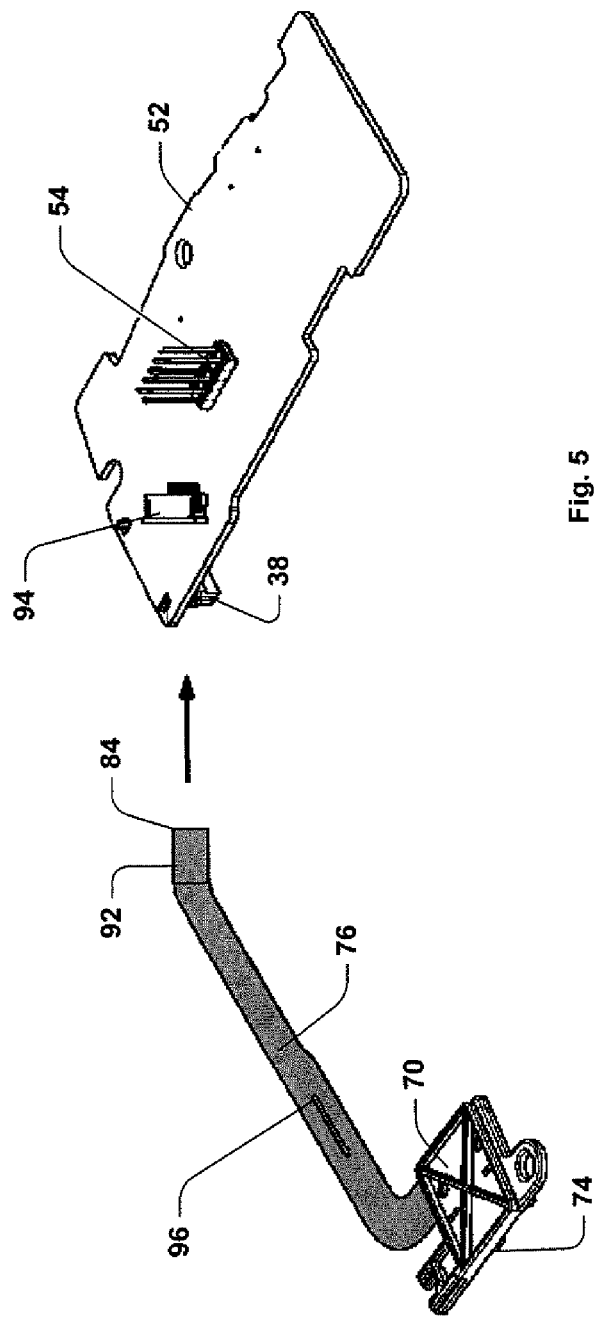
FIG. 5 is a perspective view of the ribbon cable assembly and its relation to the printed circuit board; and, FIG. 6 is a functional block diagram of the SCCM showing its interconnections with other steering column and vehicular systems.

A connector plate 70 is mounted directly over the other window 62 and, as with the PCB, the connector plate's position is established by a locating pin 72 and by a screw fastener (not shown). Connector plate 70, which is perhaps best seen in the component drawings of FIGS. 4 and 5, serves as a support base for a stalk switch module connector 74. As shown in FIGS. 4 and 5, stalk switch module connector 74 is physically and electrically attached to a flexible ribbon cable 76. To provide a robust physical connection to the ribbon cable, connector 74 is provided with two metal solder feet 78, one on either side thereof. The solder feet 78 include upright tabs that are press-fit into slots on either side of the connector. Module connector 74 further includes a series of pins 80 for solder connection to individual conductors on ribbon cable 76.

Ribbon cable 76 includes multiple parallel electrical conductors running along its length, embedded in and covered by a non-conductive plastic covering, and terminating at ribbon cable ends 82 and 84. The first end 82 of the ribbon cable has a number of solder pads 86, including two large pads for solder attachment to the feet 78 of connector 74 and an array for smaller solder attachments for the pins 80 of connector 74. The large pads are not electrically connected to any of the ribbon cable conductors, but each of the smaller solder attachments of the array of solder pads is in fact an end of a corresponding one of the conductors of the ribbon cable 76. Solder connections are formed between pins 80 and feet 78 on the one hand, and solder pads 86 on the other hand, by reflow soldering. The first end 82 of ribbon cable 76, in turn, is fixed to connector plate 70 by a heat-activated adhesive. Alignment holes 88 in the ribbon cable 76 are used during the manufacturing process for precise alignment of end 82 of ribbon cable 76 with the connector 74, on the one side, and connector plate 70, on the other side.

At the second end 84 of ribbon cable 76, the insulating cover of the ribbon cable is stripped from one side of the cable to expose terminal ends 90 of the cable. The exposed terminal ends 90 are gold plated, and the end 84 is reinforced for stiffness by the addition of a small square of additional plastic 92 (see FIG. 5) on the side opposite the exposed terminal ends 90.

As best seen in FIG. 5, PCB 52 has mounted thereon a zero-insertion-force ribbon connector 94 for receiving and securely holding the second end 84 of ribbon cable 76, thereby providing electrical and mechanical connections with that end of the ribbon cable. Electrical continuity is thus established from the switches in the right stalk switch module 30, through the mating connectors of the receptacle 34 (i.e., the unnumbered connector on the bottom of the right stalk switch module 30 and the connector 74 at the first end of the ribbon cable 76), through the ribbon cable 76, through the zero-insertion-force ribbon connector 94, and into the heart of PCB 52.

The length and geometry of the ribbon cable 76 is chosen to match the routing path of the cable in the SCCM housing 50, and is deliberately made somewhat longer than the path length so that, when the connector plate 70 and PCB 52 are fixed in place over the receptacle windows 62 and 64, some slack exists in the ribbon cable. The slack insures that the positioning of connector plate 70 and PCB 52 can be properly defined by their respective locator pins and fasteners. The ribbon cable 76 has an elongated slot 96 for receiving a pin 98 molded into the housing 50. The pin is friction captured in the elongated slot, assisting in routing of the ribbon cable and in reducing vibration of the cable.

Following installation of the components (including PCB 52, ribbon cable 76, and connector plate 70) into the housing 50, the back 56 is temporarily snapped in place over the housing. The back 56 is then fixed more securely in place with four screws, not shown. The right and left stalk switch modules are pressed into the respective side receptacles 34 and 58 and each is fastened to housing 50 with two screws. The assembled SCCM is then ready for installation on the steering column of a motor vehicle.

Figure 6:
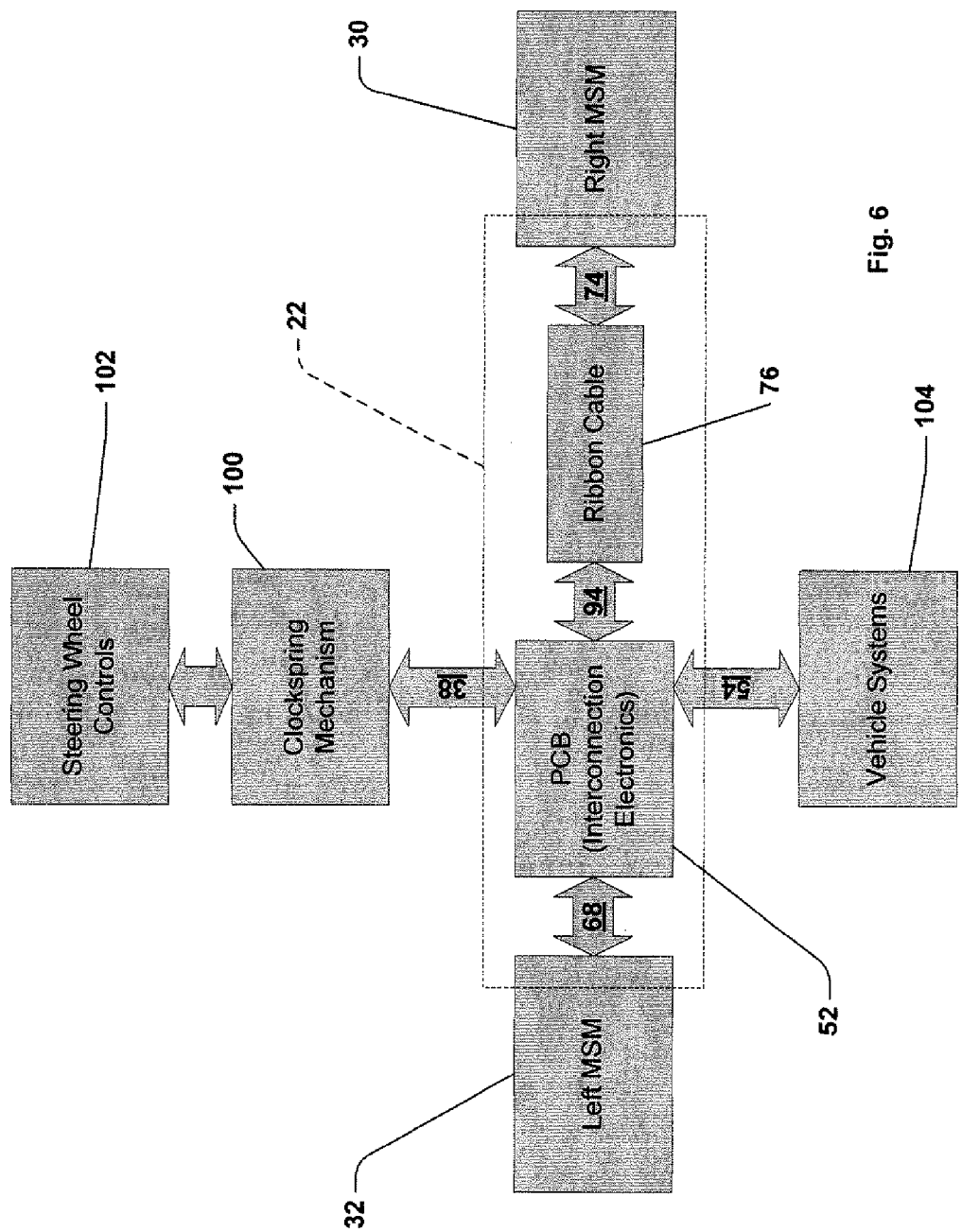

The connection between SCCM 22 and other parts of the steering wheel assembly is shown in block diagram form in FIG. 6. As shown in this figure, PCB 52 is equipped with four connectors. Module connector 68 provides electrical connection to left stalk switch module 32. Ribbon connector 94 provides electrical connection to ribbon cable 76, which in turn is connected to right stalk switch module 30 via module connector 74. Upstream connector 38 provides electrical connection to a clockspring mechanism 100, which in turn is connected to steering wheel controls and elements 102, all located upstream of the SCCM 22. Downstream connector 54 provides electrical connection to systems downstream of the SCCM 22 via the vehicle wiring harness, from which the signals are distributed to the vehicle body control module, safety control module, and other vehicle systems, indicated collectively at 104.

The role of PCB 52 in this arrangement is to provide the proper interconnection path between these various elements. Some electrical lines, such as the firing lines for the driver side air bag, are more or less routed directly through the PCB 52 from one connector to another without change. However, PCB 52 is populated with electronic components for conditioning and/or combining other signals from the various elements into a form suitable for communication to other, downstream vehicle system. In particular, PCB 52 will include digital bus interface components designed to interface the switches and other steering wheel hardware with standard vehicle serial communication busses, including for example LIN and CAN busses and one or more safety system busses.

From the above description of the invention, those skilled in the art will perceive improvements, changes and modifications. Such improvements, changes and modifications within the skill of the art are intended to be covered by the appended claims.

Having described the invention, the following is claimed:

1. A steering column control module comprising:
   a housing having at least two receptacles adapted for receiving respective switch modules;
   a printed circuit board mounted in said housing, said printed circuit board having a first module connector and a ribbon connector mounted thereon;
   a second module connector mounted in said housing remote from said printed circuit board; and,
   a ribbon cable connected between said ribbon connector and said second module connector;
   wherein said first and second module connectors are positioned in said module such that, when switch modules are inserted into respective said receptacles, said switch modules connect to respective ones of said first and second module connectors.

2. A steering column control module as set forth in claim 1, wherein module is adapted for installation on a steering column of a motor vehicle and wherein said at least two receptacles are on opposite sides of said steering column.

3. A steering column control module as set forth in claim 2, wherein said printed circuit board is mounted such that said first module connector is adjacent a first said receptacle, and said second module connector is mounted adjacent a second said receptacle, and said ribbon cable must cross from one side of said steering column to the other.

4. A steering column control module as set forth in claim 1, wherein said ribbon cable is longer than the routing path it must follow between said first and second module connectors.

5. A steering column control module as set forth in claim 4, wherein said first and second module connectors are fixed in said housing at locations defined by respective locator pins.

6. A steering column control module as set forth in claim 4, wherein said housing has a stabilizing pin therein passing transversely through the routing path of said ribbon cable, and said ribbon cable has an elongated slot therein for receiving and frictionally engaging said stabilizing pin.

7. A steering column control module as set forth in claim 1, wherein said ribbon connector is a zero insertion force connector and the end of said ribbon cable is adapted for insertion into said zero insertion force connector.

8. A steering column control module as set forth in claim 1, wherein said second module connector is soldered to an end of said ribbon cable.

9. A steering column control module as set forth in claim 8, and further comprising a connector plate, said second module connector and attached ribbon cable being fastened thereto.

10. A steering column control module as set forth in claim 1, and further comprising an upstream connector for connection to upstream electrical components, and a downstream connector for connection to downstream electrical components, both of said upstream and downstream connectors being mounted on said printed circuit board.

11. A steering column control module as set forth in claim 10, wherein said printed circuit board has mounted thereon electrical components for assembling serial bus messages from the signals received from said first and second module connectors and from said upstream connector, and for communicating said serial bus messages to downstream electrical components via said downstream connector.

12. A steering column control module, said module comprising:
   a housing adapted for mounting on a steering column of a motor vehicle, said housing having at least two receptacles for receiving respective plug-in multi-switch modules, said two receptacles being disposed on opposite sides of said steering column when said housing is installed on a steering column;

a printed circuit board mounted in said housing, said printed circuit board carrying electrical bus interface components for digital communication with downstream vehicle systems;

said printed circuit board having mounted thereon a plurality of electrical connectors including a first module connector adapted to receive and mate with a matching electrical connector on a plug-in multi-switch module, a ribbon connector adapted to receive one end of a ribbon cable, an upstream connector adapted for connection with electrical components upstream from said module, and a downstream connector adapted for connecting with vehicle systems downstream from said module;

a ribbon cable having first and second ends, where said second end is plugged into said ribbon connector on said printed circuit board; and a second module connector, mounted in said module remote from said printed circuit board, adapted to receive and mate with a matching electrical connector on a plug-in multi-switch module, said first end of said ribbon cable being electrically joined to said second module connector;

wherein said first and second module connectors are mounted with respect to respective said receptacles such that, when said multi-switch modules are inserted into the respective said receptacles, each said first and second module connector receives and mates with the matching connector of the respective said multi-switch module.

13. A steering column control module as set forth in claim 12, wherein said ribbon cable is longer than the routing path it must follow between said first and second module connectors.

14. A steering column control module as set forth in claim 13, wherein said first and second module connectors are fixed in said housing at locations defined by respective locator pins.

15. A steering column control module as set forth in claim 13, wherein said housing has a stabilizing pin therein passing transversely through the routing path of said ribbon cable, and said ribbon cable has an elongated slot therein for receiving and frictionally engaging said stabilizing pin.

16. A steering column control module as set forth in claim 12, wherein said ribbon connector is a zero insertion force connector and the end of said ribbon cable is adapted for insertion into said zero insertion force connector.

17. A steering column control module as set forth in claim 12, wherein said second module connector is soldered to an end of said ribbon cable.

18. A steering column control module as set forth in claim 17, and further comprising a connector plate, said second module connector and attached ribbon cable being fastened thereto.

19. A steering column control module as set forth in claim 12, wherein said printed circuit board has mounted thereon electrical components for assembling serial bus messages from the signals received from said first and second module connectors and from said upstream connector, and for communicating said serial bus messages to downstream electrical components via said downstream connector.

* * * * *